United States Patent [19]
Baumann et al.

[11] Patent Number: 5,831,346
[45] Date of Patent: *Nov. 3, 1998

[54] METHOD AND APPARATUS FOR CONTROL OF POWER SUPPLY COUPLING ON COMPUTER BACKPLANE

[75] Inventors: Juergen Baumann, Unterhaching; Istvan J. Vadasz, Munich, both of Germany

[73] Assignee: Force Computers, Inc., San Jose, Calif.

[21] Appl. No.: 676,706

[22] Filed: Jul. 8, 1996

[*] Notice: This patent issued on a continued prosecution application filed under 37 CFR 1.53(d), and is subject to the twenty year patent term provisions of 35 U.S.C. 154(a)(2).

[51] Int. Cl.$^6$ ........................................................ H02J 7/00
[52] U.S. Cl. .............................................................. 307/64
[58] Field of Search ........................... 307/44, 49, 54, 307/63, 64, 69, 71, 80, 85; 364/492, 707; 365/226, 227, 228; 363/50, 55

[56] References Cited

U.S. PATENT DOCUMENTS

| | | | |
|---|---|---|---|
| 4,868,832 | 9/1989 | Marrington et al. | 371/66 |
| 5,151,907 | 9/1992 | Robbins | 371/66 |
| 5,184,025 | 2/1993 | McCurry et al. | 307/66 |
| 5,588,054 | 12/1996 | Shin et al. | 379/413 |

*Primary Examiner*—Matthew V. Nguyen
*Attorney, Agent, or Firm*—Townsend and Townsend and Crew LLP; Kenneth R. Allen

[57] ABSTRACT

In a computer system, which comprises a plurality of system components, typically in the form of circuit card units, and a common power bus for interconnecting the circuit card units, there are provided a main power supply, an auxiliary power supply and control switches on the power-supplying rails for selectively activating and deactivating circuit elements on the system components (in the form of circuit cards) so that as cards are added or removed, the power can be carefully controlled. According to an insertion method of the invention, undesired disruption of power is prevented by proper sequential deactivation and activation of the power lines from the main power supply and the auxiliary power supply, both of which are for providing power to multiple card units simultaneously. A live removal method also prevents undesired power disturbances. The power control switches and portions of the switch control logic may reside in the removable portion of the system architectures or on the system backplane or in the power supply.

3 Claims, 3 Drawing Sheets

METHOD AND APPARATUS FOR CONTROL OF POWER SUPPLY COUPLING ON COMPUTER BACKPLANE

BACKGROUND OF THE INVENTION

This invention relates to maintenance of continuously powered computer systems and more particularly to so-called "live" insertion and removal of circuit card units and associated power up sequences.

Live insertion and removal of circuit card units can cause unacceptable variations in loading (surges) in other circuit cards due to the finite impedance of the conventional common power source supplying all of other card units. This problem is particularly acute in systems and applications where the speed of data transmission is affected by changes in power supply voltage, such as high-speed data buses, where transient undershoot and overshoot can result in corrupted data.

One solution is to provide independent power supplies for each circuit card unit, thus providing complete impedance isolation. However, that solution is extremely expensive and cumbersome.

What is needed is a mechanism for protecting against undesired transients upon insertion and removal of circuit card units during continued operation of other circuit card units connected to a common bus.

SUMMARY OF THE INVENTION

According to the invention, in a computer system, which comprises a plurality of system components, typically in the form of circuit card units, and a common power bus for interconnecting the circuit card units, there are provided a main power supply, an auxiliary power supply and control switches on the power-supplying rails for selectively activating and deactivating circuit elements on the system components (in the form of circuit cards) so that as cards are added or removed, the power can be carefully controlled. According to an insertion method of the invention, undesired disruption of power is prevented by proper sequential deactivation and activation of the power lines from the main power supply and the auxiliary power supply, both of which are for providing power to multiple card units simultaneously. A live removal method also prevents undesired power disturbances. The power control switches and portions of the switch control logic may reside in the removable portion of the system architectures or on the system backplane or in the power supply.

The invention will be better understood by reference to the following detailed description, taken in conjunction with the following drawings.

DESCRIPTION OF THE PREFERRED EMBODIMENT

Figure 1:
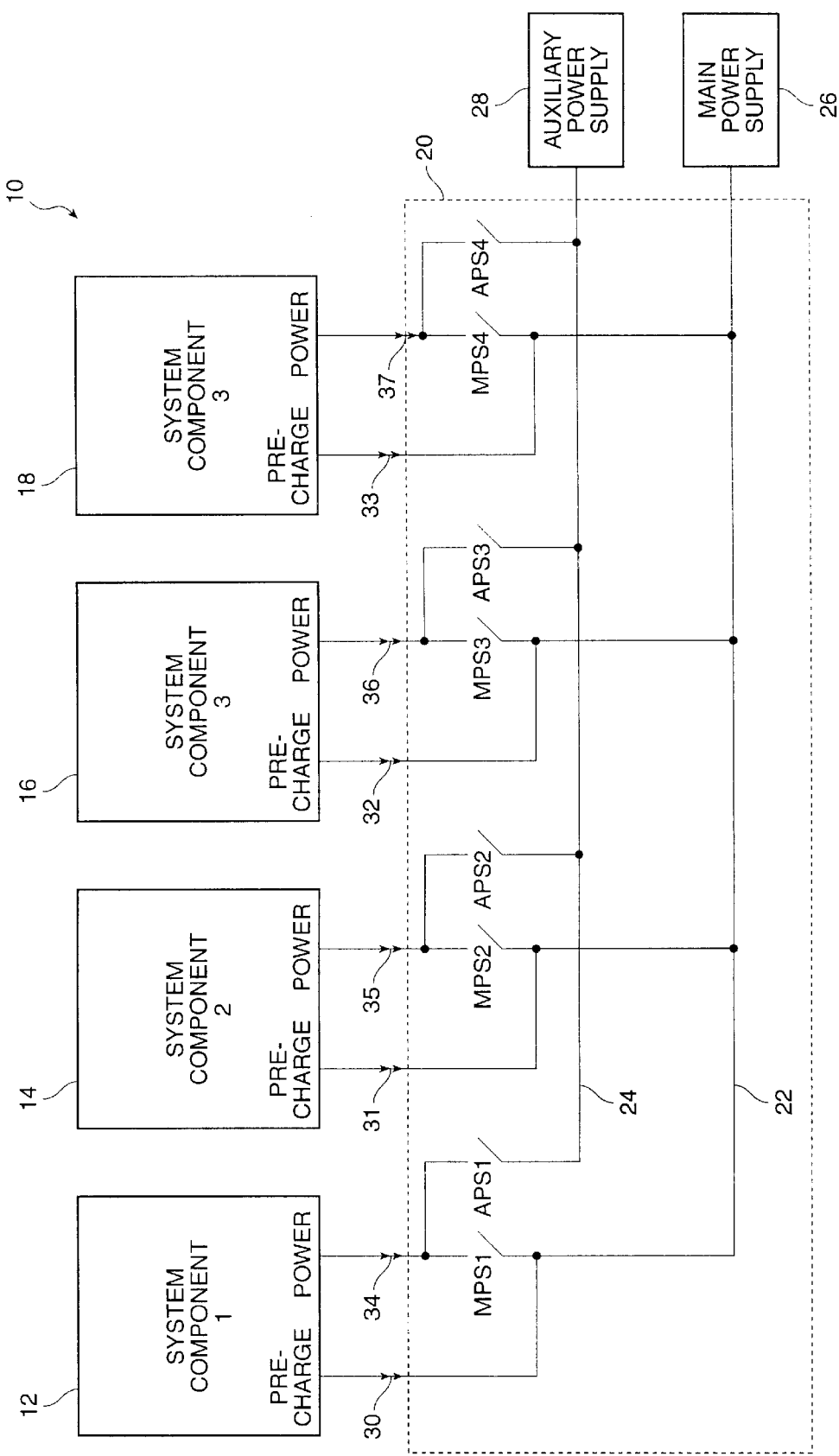
FIG. 1 is a block diagram of the power supply arrangement in a computer system according to the invention.

Referring to FIG. 1, there is a block diagram of the power supply arrangement in a computer system 10 according to the invention having a plurality of system components in the form of circuit card units 12, 14, 16, 18 coupled via a bus system 20 (showing only representative power conveying rails 22, 24) to a main power supply 26 and an auxiliary power supply 28. Power is provided to the computer system components 12, 14, 16, 18 via main power supply 26 and an auxiliary power supply 28 through pre-mating connectors 30–33 and 34–37 for precharge and supply of some primary control structures and through connectors 34–37 for operational supply power. Individual switches MPS1–MPS4 and APS1–APS4 allow a system component 12, 14, 16, 18 to be connected to the power supply units 26, 28 in various combinations and sequences. (Not shown, the main power supply 26 and the auxiliary power supply 28 also have individual on/off switch control and a ground return rail, which is part of the bus.) The main power supply 26 is connected directly to the system components without use of the switches MPS1–MPS4 via the pre-mating connectors 30–33 to provide precharge voltage to the system bus interface signals and to power some primary control components.

The auxiliary power supply 28 is provided to supply power to only one of the system components at a time which, according to the invention, allows the selected system component to be inserted, powered up and stabilized before the power of the main power supply 26 is tapped. It also allows the main power supply 26 to be disconnected without loss of power to the selected system component, so that the provision of power to other system components can remain smooth and undisturbed when the selected system component is powered off and removed.

Figure 2:
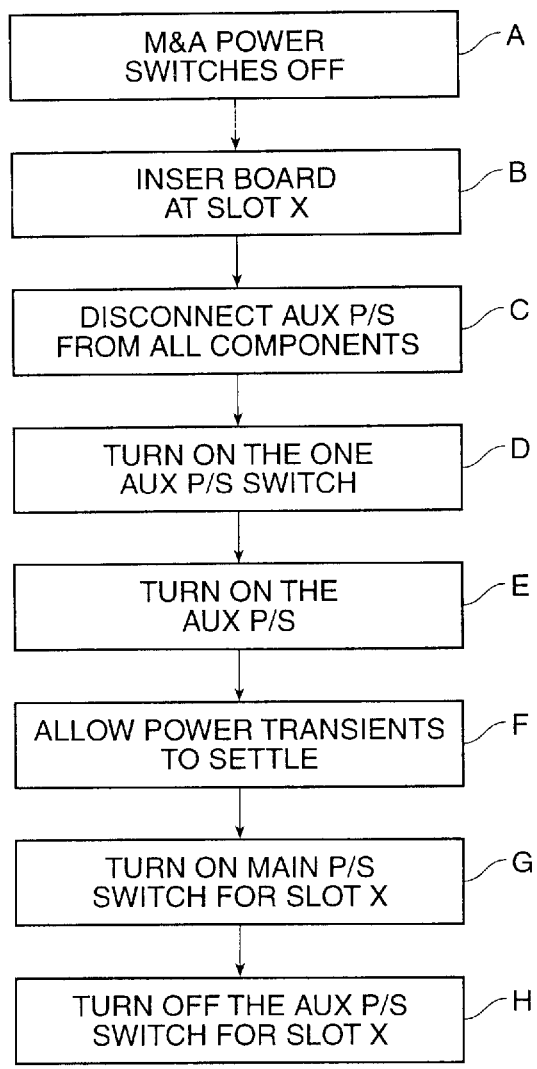
FIG. 2 is a flow chart of the procedure for activating a circuit card unit in a computer system under powered conditions.

Referring to FIG. 2, according to the invention, the live insertion and power up sequence of a typical system component 12 is as follows:

1. Verify that the main and auxiliary power switches MPS1–4 and APS1–4 are off (Step A).

In this state or condition, the system component can be inserted into any available slot 1–4. (The precharge voltage—if needed—is not subject to switching on/off, but it is not activated with the main power off.)

2. Insert the system component in slot x and lock (Step B). With the main power supply on, only trivial precharge power is drained by the system component.

3. Make sure that the auxiliary power supply is disconnected from all system components. (The auxiliary power supply must be switched off before proceeding.) (Step C)

4. Turn on the auxiliary power supply switch corresponding to the inserted system component at slot x (Step D).

5. Turn on the auxiliary power supply unit itself (Step E).

This step applies full power to the newly inserted system component without disrupting the main power of the overall system. Stop the procedure in the case of any disorder, such as a short circuit on any of the supply rails. (If so, turn off the auxiliary power supply as well as the one auxiliary power supply switch for slot x.)

6. Allow power transients on the designated system component to settle (Step F). After all power rails of the auxiliary power supply are sensed to be within their tolerances and thus stabilized, the main power supply switch for slot x can be turned on.

7. Turn on the main power supply switch for slot x (Step G). At this time both power supplies are connected in parallel, which makes it necessary that the power supply units used be able tolerate this state.

8. Thereafter turn off the auxiliary power supply switch at slot x (Step H). Ideally, it does not then source supply current to the system component, so the auxiliary power supply switch corresponding to slot x can and must be switched off.

Figure 3:
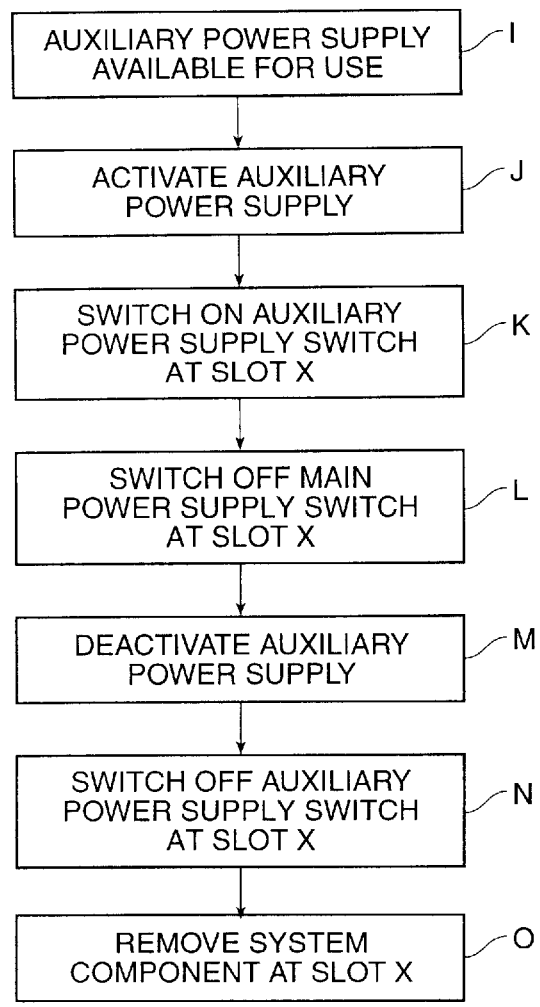
FIG. 3 is a flow chart of the procedure for removing and deactivating a circuit card unit in a computer system under powered conditions.

The sequence for live removal is also important. In accordance with the invention (FIG. 3), it is as follows:

1. Make sure that the auxiliary power supply is available, being isolated from all system components (Step I).
2. Activate the auxiliary power supply (Step J).
3. Switch on the auxiliary power supply switch corresponding to slot x, where the system component is to be removed (Step K). The system component thus can receive power from either source.
4. Switch off the main power supply switch at slot x (Step L).
5. Switch off the auxiliary power supply (Step M). The system component being already disconnected from the main power rail powering the other system components, the switching transients do not disturb the other system components.
6. Switch off the auxiliary power supply switch corresponding to the designated slot x (Step N).
7. Remove the system component unit from the designated slot x (Step O).

The invention has now been explained with reference to specific embodiments. Other embodiments will be apparent to those of ordinary skill in the art. It is therefore not intended that this invention be limited except as indicated by the appended claims.

What is claimed is:

1. In a computer system (10) having a single main power supply (26) and a plurality of system components (12, 14, 16, 18) coupled via power connectors (34–37) to said main power supply, a bus system (20) coupled to said main power supply (26) via bus rails (22, 24), the improvement comprising:

a single auxiliary power supply (28) operative to fully substitute for said main power supply in cooperation with main power supply switches and auxiliary power supply switches;

main power supply switches (MPS1–MPS4) connected between said bus rails (22, 24) to said main power supply and individual ones of said power connectors (34–37) for said system components; and auxiliary power supply switches (APS1–APS4) connected between said bus rails (22, 24) to said auxiliary power supply and individual ones of said power connectors (34–37) for said system components;

to allow any one of said system components (12, 14, 16, 18) to be connected while other system components are operating alternately and jointly to said main power supply (26) and said auxiliary power supply (28) in various combinations and sequences.

2. In a computer system (10) having a single main power supply (26) and a plurality of system components (12, 14, 16, 18) coupled via power connectors (34–37), a bus system (20) coupled to said main power supply (26) via bus rails (22, 24), and additionally having a single auxiliary power supply and a plurality of main power supply switches (MPS1–MPS4) connected between said bus rails (22, 24) to said main power supply and individual ones of said power connectors (34–37) for said system components and a plurality of auxiliary power supply switches (APS1–APS4) connected between said bus rails (22, 24) to said auxiliary power supply and individual ones of said power connectors (34–37) for said system components a method for live insertion of system components comprising the steps of:

A. verifying that the main power supply switches and the auxiliary power switches are off;
B. inserting the system component in a selected empty slot x;
C. assuring that the auxiliary power supply is disconnected from all system components;
D. turning on the auxiliary power supply switch corresponding to the inserted system component at slot x; thereafter
E. turning on the auxiliary power supply unit to apply full power to the inserted system component without disrupting the main power of the overall system;
F. allowing time for power transients on the designated system component to settle;
G. turning on the main power supply switch corresponding to the inserted system component at slot x; and thereafter
H. turning off the auxiliary power supply switch at slot x.

3. In a computer system (10) having a single main power supply (26) and a plurality of system components (12, 14, 16, 18) coupled via power connectors (34–37), a bus system (20) coupled to said main power supply (26) via bus rails (22, 24), and additionally having a single auxiliary power supply and a plurality of main power supply switches (MPS1–MPS4) connected between said bus rails (22, 24) to said main power supply and individual ones of said power connectors (34–37) for said system components and a plurality of auxiliary power supply switches (APS1–APS4) connected between said bus rails (22, 24) to said auxiliary power supply and individual ones of said power connectors (34–37) for said system components a method for live removal of system components comprising the steps of:

A. assuring that the auxiliary power supply is available and isolated from all system components;
B. activating the auxiliary power supply;
C. switching on the auxiliary power supply switch corresponding to slot x, where the system component is to be removed;
D. switching off the main power supply switch at said slot x; thereafter
E. switching off the auxiliary power supply; thereafter
F. switching off the auxiliary power supply switch corresponding to said slot x; and
G. removing the system component from said slot x.

* * * * *

UNITED STATES PATENT AND TRADEMARK OFFICE
CERTIFICATE OF CORRECTION

PATENT NO.    : 5,831,346

DATED         : November 3, 1998

INVENTOR(S)   : Juergen Baumann & Istvan Vadasz

It is certified that an error appears in the above-identified patent and that said Letters Patent is hereby corrected as shown below:

On the title page, item [75]
The second listed inventor Istvan Vadasz should have no middle initial.

Signed and Sealed this

Sixteenth Day of March, 1999

Attest:

Q. TODD DICKINSON

*Attesting Officer*          *Acting Commissioner of Patents and Trademarks*